(12) United States Patent
Ozeki et al.

(10) Patent No.: US 7,456,484 B2
(45) Date of Patent: Nov. 25, 2008

(54) SEMICONDUCTOR DEVICE HAVING IGBT AND DIODE

(75) Inventors: Yoshihiko Ozeki, Nukata-gun (JP); Norihito Tokura, Okazaki (JP); Yukio Tsuzuki, Nukata-gun (JP)

(73) Assignee: Denso Corporation, Kariya (JP)

( * ) Notice: Subject to any disclaimer, the term of this patent is extended or adjusted under 35 U.S.C. 154(b) by 35 days.

(21) Appl. No.: 11/648,894

(22) Filed: Jan. 3, 2007

(65) Prior Publication Data

US 2007/0158680 A1    Jul. 12, 2007

(30) Foreign Application Priority Data

Jan. 10, 2006    (JP)    ............... 2006-002676

(51) Int. Cl.
*H01L 21/00*    (2006.01)
(52) U.S. Cl. ............... 257/506; 438/329; 257/E29.027; 257/E29.028; 257/E29.066; 257/E29.067
(58) Field of Classification Search ................ 257/147, 257/E29.027–E29.028, 350, 361
See application file for complete search history.

(56) References Cited

U.S. PATENT DOCUMENTS 5,464,994 A * 11/1995 Shinohe et al. ............. 257/147
6,639,295 B2 * 10/2003 Majumdar et al. .......... 257/506

* cited by examiner

*Primary Examiner*—Kimberly D Nguyen
*Assistant Examiner*—Mamadou Diallo
(74) *Attorney, Agent, or Firm*—Posz Law Group, PLC

(57) ABSTRACT

A semiconductor device includes: a semiconductor substrate having first and second semiconductor layers; an IGBT having a collector region, a base region in the first semiconductor layer, an emitter region in the base region, and a channel region in the base region between the emitter region and the first semiconductor layer; a diode having an anode region in the first semiconductor layer and a cathode electrode on the first semiconductor layer; and a resistive region. The collector region and the second semiconductor layer are disposed on the first semiconductor layer. The resistive region for increasing a resistance of the second semiconductor layer is disposed in a current path between the channel region and the cathode electrode through the first semiconductor layer and the second semiconductor layer with bypassing the collector region.

12 Claims, 9 Drawing Sheets

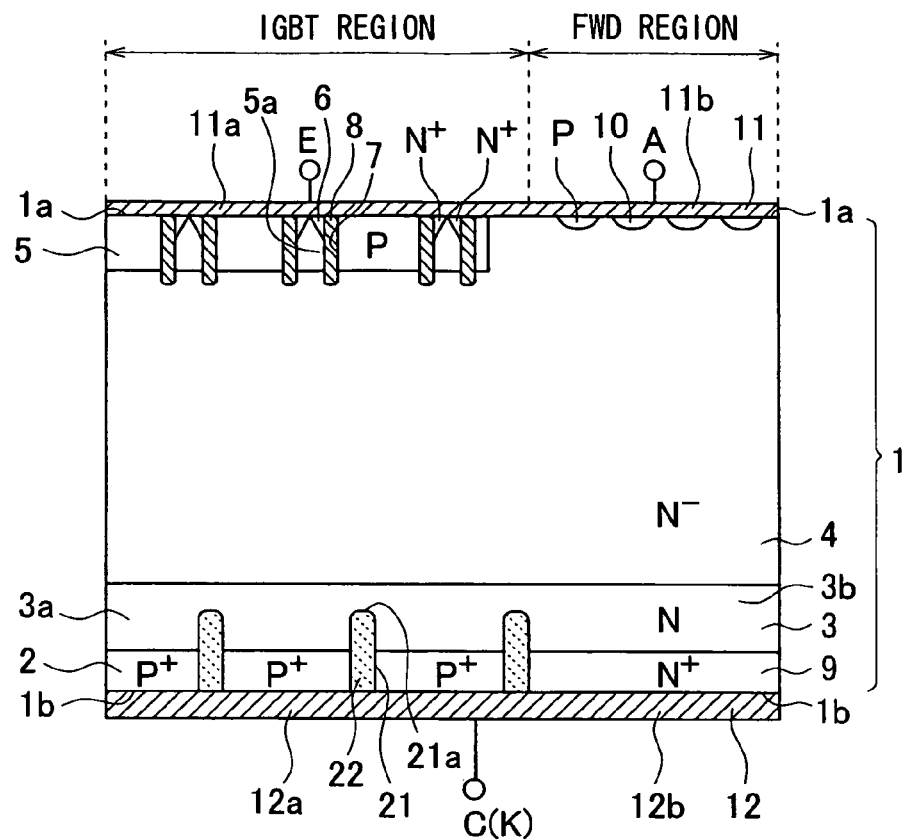
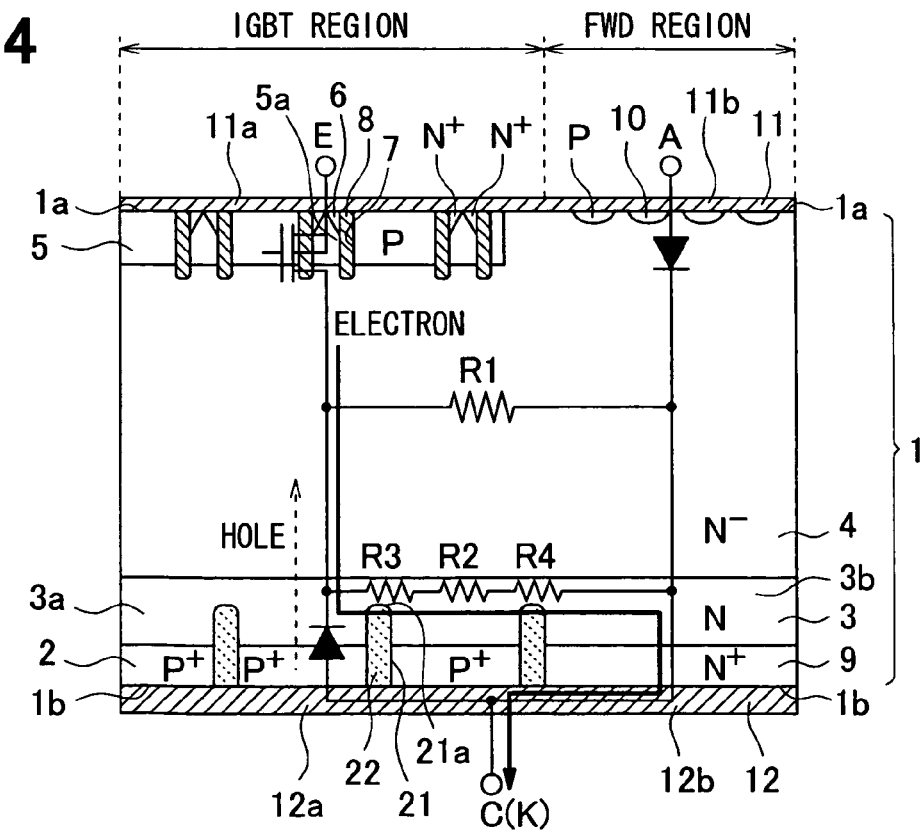

SEMICONDUCTOR DEVICE HAVING IGBT AND DIODE

CROSS REFERENCE TO RELATED APPLICATION

This application is based on Japanese Patent Application No. 2006-2676 filed on Jan. 10, 2006, the disclosure of which is incorporated herein by reference.

FIELD OF THE INVENTION

The present invention relates to a semiconductor device having an IGBT and a diode.

BACKGROUND OF THE INVENTION

In a semiconductor device in which an IGBT and a free wheel diode (hereinafter called FWD) connected in parallel with each other are formed within the single semiconductor substrate, there is formerly a structure in which a trench burying an insulator therein is formed between an IGBT area for forming a semiconductor area belonging to IGBT and a diode area for forming a semiconductor area belonging to the diode among the semiconductor substrate. The device is disclosed in, e.g., JP-A-2002-314082 (corresponding to U.S. Pat. No. 6,639,295).

As can be seen from a description in which the trench is formed so as to be deeper than an anode area of the diode from a surface side of the semiconductor substrate, this is a technique for restraining the movement of a carrier on the surface side of the semiconductor substrate and reducing an interference of IGBT and the diode.

When an IGBT of a punch through type and a FWD connected in parallel with each other are formed within the single semiconductor substrate, it has been found that a problem explained below is caused.

FIG. 14 shows a cross-sectional view of the semiconductor device of a structure considered by the present inventors as a comparison of the present disclosure. In FIG. 14, a sectional structure and an equivalent circuit of this semiconductor device are shown together, and the same reference numerals as FIG. 1 are given to constructional portions similar to those of FIG. 1.

In the semiconductor device shown in FIG. 14, IGBT of the punch through type and FWD connected in parallel with each other are formed within the single semiconductor substrate 1. This IGBT is a longitudinal type and is also an N-channel type.

In the semiconductor substrate 1 within FIG. 14, an area for forming plural semiconductor areas constituting the IGBT is an IGBT area, and an area for forming plural semiconductor areas constituting the FWD is an FWD area. Concretely, a P$^+$ type collector area 2, N type layers 3, 3a, an N$^-$ type layer 4, a P type base area 5 and an N$^+$ type emitter area 6 constituting IGBT are formed in the IGBT area. A gate electrode 8 buried within a trench 7 is formed in the P type base area 5 of the IGBT area. Further, an N$^+$ type area 9, N type layers 3, 3b, an N$^-$ type layer 4 and a P type area 10 constituting FWD are formed in the FWD area.

N type layers 3a, 3b, 3 among these areas and layers are areas higher in impurity concentration than the N$^-$ type layer 4, and function as a field stopper layer (hereinafter called an FS layer) for preventing that the spread of a depletion layer at a bias time between the collector and the emitter reaches the P$^+$ type collector area 2.

Further, a single electrode 11 of a shape formed by continuing an emitter electrode (E) 11a of IGBT and an anode electrode (A) 11b of FWD is formed on the surface of the semiconductor substrate 1. A single electrode 12 of a shape formed by continuing a collector electrode (C) 12a of IGBT and a cathode electrode (K) 12b of FWD is formed on the rear face of the semiconductor substrate 1.

In the semiconductor device of such a structure, when an N channel 5a is formed in a rear face side diode 31 located on the rear face side of the semiconductor substrate 1 in the IGBT area, i.e., in a portion adjacent to the gate electrode 8 of the P type base area 5, it attains a structure in which a cathode (FS layer 3a) and an anode (collector electrode 12a) of the PN junction diode 31 constructed by P$^+$ type area 2, N type layer 3, N$^-$ type layer 4, N channel 5a and N$^+$ type area 6 are short-circuited through the N type FS layer 3b of the FWD area, the N$^+$ type area 9 and the cathode electrode 12b between the collector and the emitter.

At this time, when an electronic electric current from an IGBT channel located on the surface side of the semiconductor substrate 1 is flowed to the rear face electrode 12 of the semiconductor substrate 1 through the N$^-$ type layer 4 within the IGBT area, the N$^-$ type layer 4 of the FWD area, the N type FS layer 3 and the N$^+$ type area 9, a resistance component of the N$^-$ type layer 4 is set to R1. When the electronic electric current from the IGBT channel is flowed to the rear face electrode 12 of the semiconductor substrate 1 through the N$^-$ type layer 4 and the N type FS layer 3a of the IGBT area, and the N type FS layer 3b and the N$^+$ type area 9 of the FWD area, a resistance component of the N type FS layer 3 of the IGBT area and the FWD area is set to R2. In this case, R1>R2 is attained.

Therefore, as shown by an arrow within FIG. 14, the electronic electric current from the IGBT channel is flowed away to the collector electrode 12a through the N type FS layer 3b of the FWD area and the N$^+$ type area 9.

Here, FIG. 15 shows I-V characteristics of the semiconductor device shown in FIG. 14 (characteristics of the collector electric current and the voltage between the collector and the emitter).

In the IGBT within the semiconductor device shown in FIG. 14, as originally shown by a broken line within FIG. 15, the collector electric current begins to be flowed when the voltage value between the collector and the emitter exceeds a predetermined voltage, e.g., 0.6V. Namely, the rear face side diode of IGBT is turned on, and IGBT is operated.

However, in the semiconductor device shown in FIG. 14, as mentioned above, the anode and the cathode of the rear face side diode 31 of the IGBT area are short-circuited. Therefore, as shown by a solid line within FIG. 15, even when the voltage value between the collector and the emitter (the voltage value of an external voltage) is increased from 0V, it is difficult that the voltage value substantially applied to the rear face side diode 31 of IGBT reaches 0.6V. Accordingly, it is delayed that the collector electric current begins to be flowed. When the electronic electric current from the IGBT channel is flowed to the rear face side electrode 12 through the N type layer 3 of the IGBT area and the FWD area so that an I×R drop in its electronic electric current path, i.e., the voltage applied to the rear face side diode 31 reaches 0.6V, the collector electric current finally begins to be flowed. Thereafter, it is returned to an original behavior. In the following description, a portion (a bent portion within I-V line) 32 surrounded by a one-dotted chain line showing a behavior different from that of a broken line among the solid line within FIG. 15 is called a snap back.

Thus, in the semiconductor device of the structure shown in FIG. 14, a problem exists in that it is difficult to forward bias the rear face side diode 31 by the external voltage, and no hole implantation from the rear face electrode 12 side is promoted, and the snap back is formed in IGBT on-characteristics.

In the semiconductor device shown in FIG. 14, the FS layer 3 is also formed in the FWD area. However, the above problem is caused in the semiconductor device in which the diode and IGBT of the punch through type having the N type FS layer 3a higher in impurity concentration than the N⁻ type layer 4 are formed in the single semiconductor substrate 1 irrespective of whether the FS layer 3 is formed in the FWD area or not. Thus, it is required to reduce generation of the snap back.

SUMMARY OF THE INVENTION

In view of the above-described problem, it is an object of the present disclosure to provide a semiconductor device having an IGBT and a diode.

According to an aspect of the present disclosure, a semiconductor device includes: a semiconductor substrate having an IGBT region and a diode region; an IGBT disposed in the IGBT region of the substrate; a diode disposed in the diode region of the substrate; and a resistive region. The semiconductor substrate has a first side and a second side opposite to the first side. The semiconductor substrate includes a first semiconductor layer having a first conductive type and a second semiconductor layer having the first conductive type. The second semiconductor layer has an impurity concentration higher than an impurity concentration of the first semiconductor layer. The second semiconductor layer is disposed on the first semiconductor layer on the second side in the IGBT region. The IGBT includes a collector region having a second conductive type, a collector electrode, a base region having the second conductive type, an emitter region having the first conductive type, an emitter electrode, a channel region, and a gate electrode. The collector region is disposed on the second semiconductor layer on the second side in the IGBT region. The collector electrode is electrically coupled with the collector region. The base region is disposed in a surface portion of the first semiconductor layer on the first side in the IGBT region. The emitter region is disposed in a surface portion of the base region. The emitter electrode is electrically coupled with the emitter region. The channel region is disposed in a part of the base region between the emitter region and the first semiconductor layer. The gate electrode contacts the channel region through a gate insulation film. The diode includes an anode region having the second conductive type, an anode electrode, and a cathode electrode. The anode region is disposed in a surface portion of the first semiconductor layer on the first side in the diode region. The anode electrode is electrically coupled with the anode region and the emitter electrode. The cathode electrode is disposed on the first semiconductor layer on the second side in the diode region. The cathode electrode is electrically coupled with the collector electrode. The resistive region for increasing a resistance of the second semiconductor layer is disposed in a part of the second semiconductor layer, which is arranged in a current path between the channel region in the IGBT region and the cathode electrode in the diode region through the first semiconductor layer and the second semiconductor layer with bypassing the collector region.

In the above device, the resistive region increases the total resistance of the current path between the channel region in the IGBT region and the cathode electrode in the diode region through the first semiconductor layer and the second semiconductor layer with bypassing the collector region. Thus, the current from the channel is prevented from bypassing the collector region. Accordingly, a snap back effect at I-V characteristics in the IGBT is reduced.

BRIEF DESCRIPTION OF THE DRAWINGS

The above and other objects, features and advantages of the present invention will become more apparent from the following detailed description made with reference to the accompanying drawings. In the drawings:

FIG. 1 is a cross sectional view showing a semiconductor device according to a first embodiment;

FIG. 4 is a schematic view showing the semiconductor device and its equivalent circuit;

DETAILED DESCRIPTION OF THE PREFERRED EMBODIMENTS

First Embodiment Mode

Figure 2A:
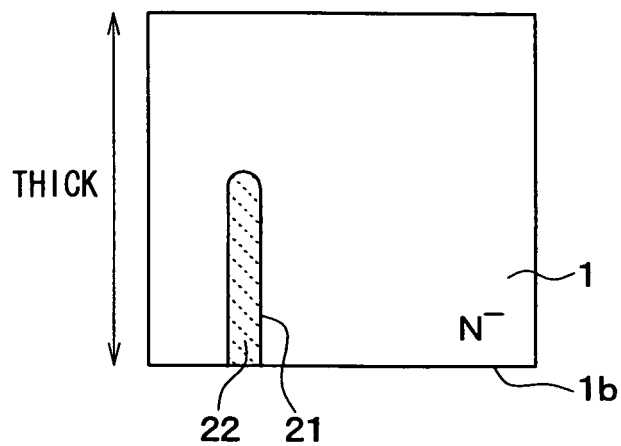
FIGS. 2A to 2C are cross sectional views showing a method for manufacturing the semiconductor device shown in FIG. 1.

FIG. 1 shows a cross-sectional view of a semiconductor device in a first example of a first embodiment mode. The semiconductor device of this embodiment mode is set to a structure in which punch through type IGBT of a longitudinal type and a FWD of a longitudinal type inversely connected in parallel with each other are formed within a single semiconductor substrate 1.

Namely, as shown in FIG. 1, the semiconductor device of this embodiment mode has a P⁺ type collector area 2, an N type FS layer 3a as a second semiconductor layer, an N⁻ type layer 4 as a first semiconductor layer, a P type base area 5 and an N⁺ type emitter area 6, which are formed in an IGBT area of the semiconductor substrate 1 and constitute IGBT. This semiconductor device also has an N⁺ type area 9, an N type FS layer 3b, the N⁻ type layer 4 as the first semiconductor layer, and a P type anode area 10 which are formed in an FWD area of the semiconductor substrate 1 and constitute FWD. In this embodiment mode, the N type and the P type respectively correspond to a first conductivity type and a second conductivity type.

Here, for example, the semiconductor substrate 1 is constructed by Si. The $N^-$ type layer 4 within the semiconductor substrate 1 functions as a drift layer in the IGBT area, and functions as a cathode area in the FWD area. Further, the FS layer 3a of the IGBT area and the N type layer 3b of the FWD area are formed so as to abut on the $N^-$ type layer 4 on the side of a rear face 1b side of the semiconductor substrate 1 in comparison with the $N^-$ type layer 4, and are formed as an N type layer 3 of a continuous shape in this embodiment mode.

Further, the $P^+$ type collector area 2 is formed so as to abut on the FS layer 3a on the rear face 1b side of the semiconductor substrate 1 in comparison with the FS layer 3a. Further, the P type base area 5 is formed on the surface (surface 1a of the semiconductor substrate 1) side of the $N^-$ type layer 4 within the $N^-$ type layer 4. Further, the $N^+$ type emitter area 6 is formed on the surface (surface 1a of the semiconductor substrate 1) side of the P type base area 5 within the P type base area 5.

A trench 7 passing through the P type base area 5 and having a depth reaching the $N^-$ type layer 4 is formed on the surface 1a of the semiconductor substrate 1. A gate electrode 8 is buried within the trench 7 through an unillustrated gate insulating film. A channel 5a is formed in a portion adjacent to the gate electrode 8 through the gate insulating film in a portion between the $N^+$ type emitter area 6 and the $N^-$ type layer 4 among this P type base area 5. p The IGBT of this embodiment mode is set to a so-called thinning-out structure in which a cell area is periodically thinned out of plural continuous cell areas with respect to IGBT of a structure for continuously arranging plural cell areas functioning as elements. Namely, the P type base area 5 is divided into plural areas by the gate electrode 8 in the leftward and rightward directions within FIG. 1. In these plural areas, a cell area having the emitter area 6 and forming the channel 5a, and an area having no emitter area 6 and thinning-out a cell for forming no channel are alternately arranged.

Further, the $N^+$ type area 9 of the FWD area is a semiconductor area higher in impurity concentration than the N type FS layer 3b of the FWD area, and is also an area in which ohmic contact with a metal constituting a cathode electrode 12b is set to an object. This $N^+$ type area 9 and the N type layer 3b of the FWD area become a cathode area of FWD. Further, plural P type anode areas 10 of the FWD area are formed on the surface side of the $N^-$ type layer 4 within the $N^-$ type layer 4. These plural P type anode areas 10 may be also changed to one continuous area.

Further, an emitter electrode (E) 11a electrically connected to the emitter area 6 of the IGBT area and an anode electrode (A) 11b electrically connected to the anode area 10 of the FWD area are formed on the surface 1a of the semiconductor substrate 1. In this embodiment mode, the emitter electrode (E) 11a and the anode electrode (A) 11b are formed as a single electrode 11 of a continuous shape, and attain a state mutually electrically connected. The emitter electrode 11a and the anode electrode 11b are formed on an interlayer insulating film, but this interlayer insulating film is omitted in FIG. 1.

A collector electrode (C) 12a electrically connected to the collector area 2 of the IGBT area and a cathode electrode (K) 12b electrically connected to the $N^+$ type area 9 of the FWD area are formed on the rear face 1b of the semiconductor substrate 1. In this embodiment mode, the collector electrode (C) 12a and the cathode electrode (K) 12b are formed as a single electrode 12 of a continuous shape, and attain a state mutually electrically connected.

Thus, IGBT and FWD are the longitudinal type since the emitter electrode 11a and the collector electrode 11b of IGBT and the anode electrode 11b and the cathode electrode 12b of FWD are respectively formed on the surface 1a and the rear face 1b of the semiconductor substrate 1. Further, since the emitter electrode 11a of IGBT and the anode electrode 11b of FWD are electrically connected, and the collector electrode 12a of IGBT and the cathode electrode 12b of FWD are electrically connected, a flowing direction of a forward electric current of IGBT and FWD becomes a reverse direction, and IGBT and the diode are connected in inverse parallel.

In this embodiment mode, plural trenches 21 are formed on the rear face 1b of the semiconductor substrate 1 within the IGBT area. These trenches 21 are arranged at an equal interval in the transversal direction in FIG. 1. One trench 21 is formed in a shape having a predetermined width and extending in a depth direction within FIG. 1. Namely, these trenches 21 are set to a planar layout arranged in a stripe shape. The transversal direction within FIG. 1 means a direction for arranging the IGBT area and the FWD area. The depth direction within FIG. 1 means a direction approximately perpendicular to the arranging direction of the IGBT area and the FWD area. Further, one trench 21 has a depth reaching the FS layer 3a from the rear face 1b of the semiconductor substrate 1. In other words, a bottom portion 21a of the trench 21 is located within the FS layer 3a.

Further, insulators 22 are buried within these trenches 21 such that the interior of the trench 21 functions as an insulating area. Concretely, the insulator 22 of one kind such as $SiO_2$, etc. is buried within the trench 21. The insulator 22 buried within this trench 21 corresponds to a resistance increasing means.

The depth and width of the trench 21, the number of trenches 21, the interval of an adjacent trench 21, etc. are arbitrarily set such that the magnitude of resistance in the transversal direction of the FS layer 3a within FIG. 1, i.e., in a direction parallel to the surface 1a of the semiconductor substrate 1 and arranging the IGBT area and the FWD area becomes a predetermined desirable magnitude.

Figure 2B:
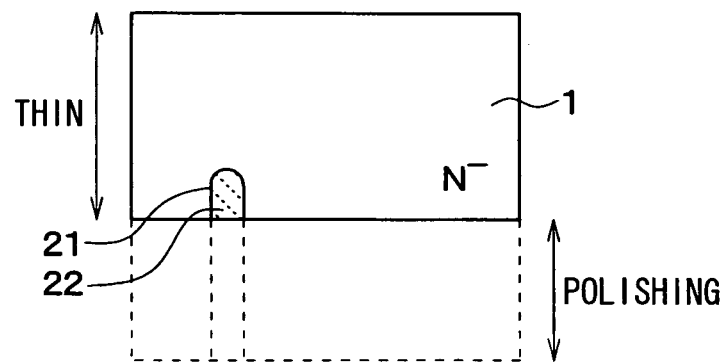
Figure 2C:
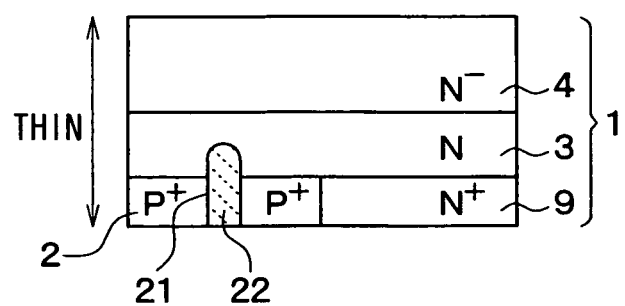

Next, a manufacturing method of the semiconductor device of the above structure will be explained. FIGS. 2A, 2B and 2C show views for explaining the manufacturing method of the semiconductor device as one example of this embodiment mode.

As shown in FIG. 2A, the semiconductor substrate 1 of an $N^-$ type is prepared. The semiconductor substrate 1 at this time is thicker than the semiconductor substrate 1 formed after the semiconductor device is manufactured. A trench 21 is then formed from the rear face 1b of the semiconductor substrate 1, and an insulator 22 is buried within the trench 21.

Subsequently, as shown in FIG. 2B, the semiconductor substrate 1 is ground from the rear face 1b side, and is thinned. A P type base area 5 of the IGBT area, an $N^+$ type emitter area 6, a gate electrode 8, a P type area 10 of the FWD area, etc. are formed before the semiconductor substrate 1 is ground from the rear face 1b side.

Subsequently, as shown in FIG. 2C, an N type layer 3, a $P^+$ type layer 2 and an $N^+$ type layer 9 are formed by ion implantation and a thermal diffusion method. Thereafter, respective electrodes 11, 12 are formed on the surface 1a and the rear face 1b of the semiconductor substrate 1, and the semiconductor device of the above structure is then manufactured via a manufacturing process similar to that of the former case.

Here, the explanation has been made with respect to a case in which the semiconductor substrate 1 is ground in the process shown in FIG. 2B after the trench 21 is formed in the process shown in FIG. 2A. However, as explained below, the sequential order of the above processes may be also changed.

Figure 3A:
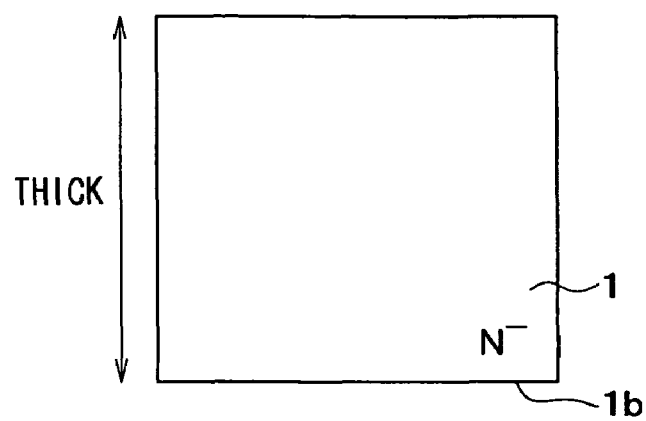
FIGS. 3A to 3C are cross sectional views showing another method for manufacturing the semiconductor device shown in FIG. 1.
Figure 3B:
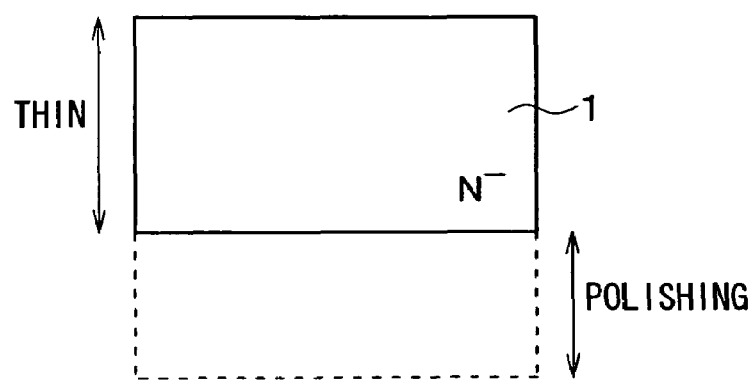
Figure 3C:
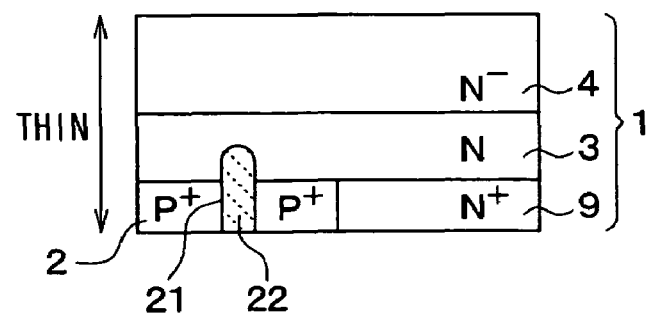

FIGS. 3A, 3B and 3C show views for explaining a manufacturing method of the semiconductor device in another example of this embodiment mode. As shown in FIG. 3A, a thick semiconductor substrate 1 is prepared. Thereafter, as shown in FIG. 3B, the semiconductor substrate 1 is ground from the rear face 1b side. Thereafter, as shown in FIG. 3C, a trench 21 is formed on the rear face 1b of the semiconductor substrate 1. Thereafter, an N type layer 3, a P+ type layer 2 and an N+ type layer 9 are formed by ion implantation and the thermal diffusion method. The sequential order of the formation of the N type layer 3, the P+ type layer 2 and the N+ type layer 9 and the formation of the trench 21 may be also replaced.

Thus, after the semiconductor substrate 1 is ground, the trench 21 can be also formed on the rear face 1b of the semiconductor substrate 1. In this case, as shown in FIGS. 2A to 2C, it is preferable to form the trench 21 on the rear face 1b of the semiconductor substrate 1 before the semiconductor substrate 1 is ground from a viewpoint of easiness of treatment of the semiconductor substrate 1. This is because the treatment of the substrate such as conveyance, etc. is facilitated since the semiconductor substrate 1 is thick even in a forming state of the trench 21 when the trench 21 is formed in the semiconductor substrate 1 of a thick state.

Next, main effects of this embodiment mode will be explained.

In this embodiment mode, plural trenches 21 of a shape for locating the bottom portion 21a within the FS layer 3a on the rear face 1b side of the semiconductor substrate 1 in the IGBT area, and extending in a direction perpendicular to an electric current path in the transversal direction within FIGS. 2 and 3 within the FS layer 3a are formed in the IGBT area. An insulator 22 is buried within this trench 21.

Thus, the distance from an end to an end in the thickness direction of the semiconductor substrate 1 of the FS layer 3a is narrowed in a forming portion of the trench 21 among the FS layer 3a of the IGBT area, and the width of the electric current path in the transversal direction within FIGS. 2 and 3 within the FS layer 3a is narrowed. Thus, the resistance of the forming portion of the trench 21 among the FS layer 3a is increased in comparison with a portion for forming no trench.

Here, FIG. 4 shows a sectional structure and an equivalent circuit of the semiconductor device of this embodiment mode together. As mentioned above, in the FS layer 3a, the width of the electric current path in the transversal direction within this figure is narrowed by the trench 21. Accordingly, it can be said that a transversal resistance component using the trench 21 is newly formed.

Therefore, when the transversal resistance component of the FS layer 3, i.e., the electronic electric current from the IGBT channel is flowed to the rear face electrode 12 of the semiconductor substrate 1 through the N⁻ type layer 4 and the N type FS layer 3a of the IGBT area, and the N type FS layer 3b and the N+ type area 9 of the FWD area, a resistance component R2' of the N type FS layer 3 of the IGBT area and the FWD area is approximately represented as a component in which a resistance component of the FS layer 3 increased by one trench, i.e., resistance components R3, R4 provided by the insulator 22 within the trench are added to a resistance component R2 provided by the FS layer 3 when no trench 21 is formed as shown below.

$$R2'=R2+R3+R4$$

As shown in FIG. 4, this formula shows the transversal resistance component R2' of the FS layer 3 when two trenches 21 are formed within a path in which the electronic electric current from the IGBT channel located on the surface side of the semiconductor substrate 1 is flowed to the rear face electrode 12 of the semiconductor substrate 1 through the N⁻ type layer 4 and the FS layer 3a within the IGBT area and the N type FS layer 3b and the N+ type area 9 of the FWD area.

Figure 14:
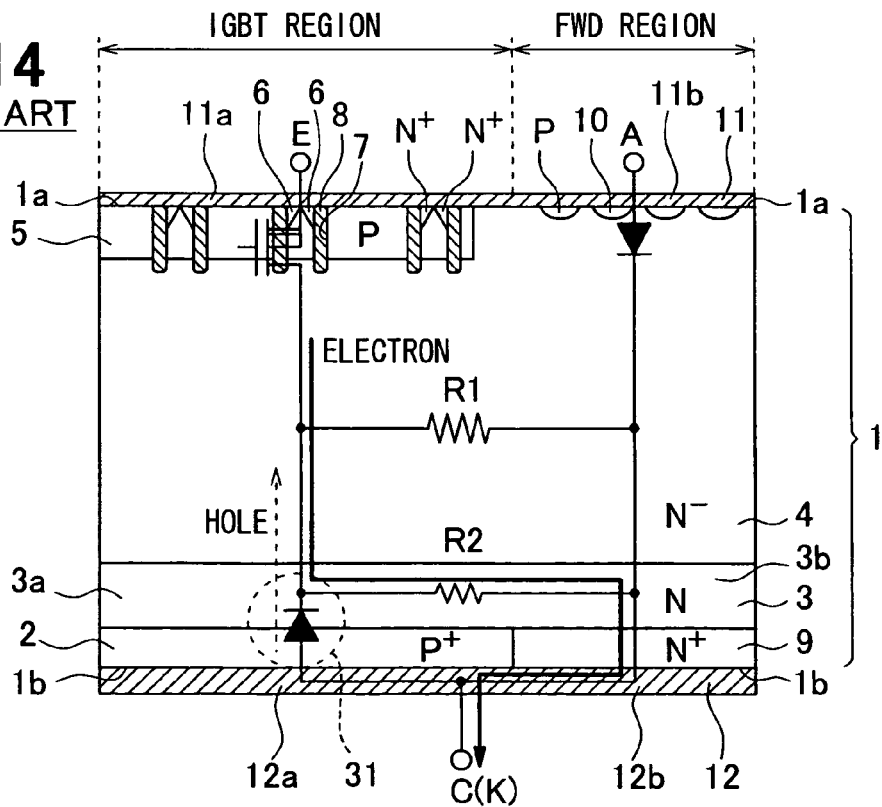
FIG. 14 is a cross sectional view showing a semiconductor device according to a comparison of the first embodiment.
Figure 15:
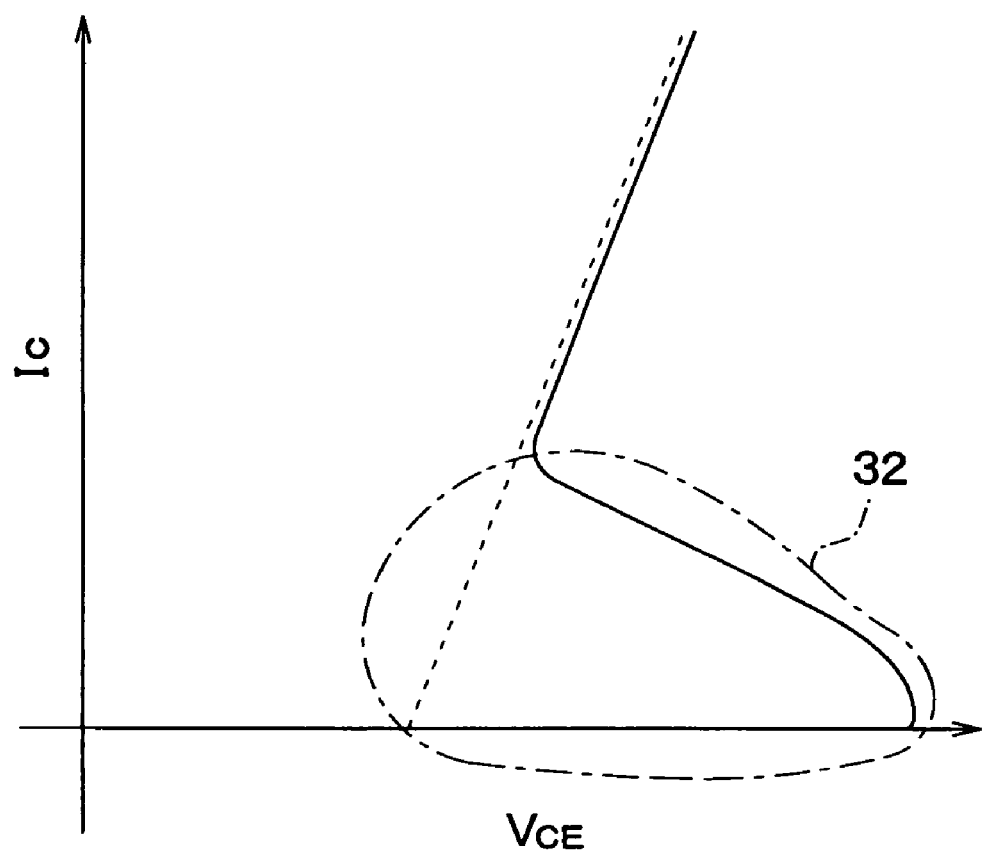
FIG. 15 is a graph showing a I-V characteristics of the device shown in FIG. 14.

Accordingly, in this embodiment mode, the transversal resistance component R2' of the FS layer 3 is increased in comparison with the transversal resistance component R2 of the FS layer 3 of the semiconductor device shown in FIG. 14 in which no trench 21 is formed on the rear face 1b of the semiconductor substrate 1 (R2<R2'). Therefore, an I×R drop in a path in which the electronic electric current from the IGBT channel from the surface passes through the FS layer 3a of the IGBT area and the N type FS layer 3b and the N+ type area 9 of the FWD area can rapidly reach a magnitude required to operate the rear face side diode of IGBT in comparison with the semiconductor device shown in FIG. 14. Thus, turning-on of the rear face diode of IGBT is assisted and hole implantation can be promoted. Namely, IGBT can be easily operated. Accordingly, in accordance with this embodiment mode, generation of the snap back can be restrained, and it is possible to approach the original I-V characteristics.

Further, it is preferable to further restrain the generation of the snap back that the depth and width of the trench 21, the number of trenches 21, the interval of the adjacent trench 21, etc. are set so as to set the transversal resistance component R2' of the FS layer 3 to be greater than the resistance component R1 of the N⁻ type layer 4 within FIG. 4, and the trench 21 is formed with respect to the FS layer 3a. For example, the transversal resistance component R2' of the FS layer 3 and the resistance component R1 of the N⁻ type layer 4 can be measured as an average value provided by dividing the resistance value of an entire area of the FS layer 3 and the N⁻ type layer 4 by the number of electric current paths.

Figure 5:
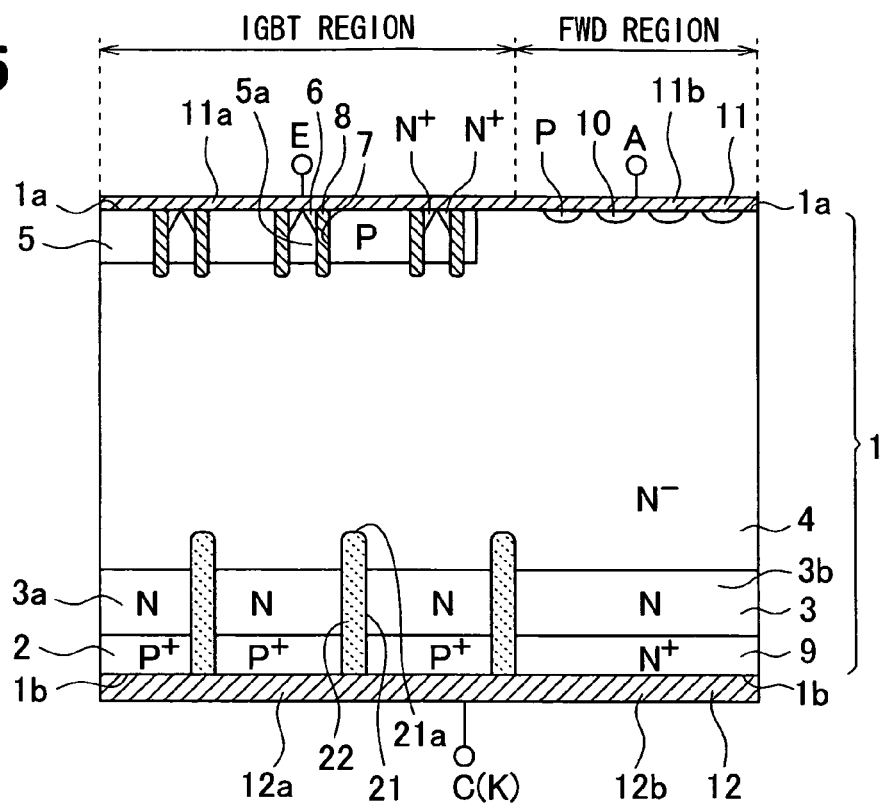
FIG. 5 is a cross sectional view showing a semiconductor device according to a modification of the first embodiment.

Next, FIG. 5 shows a cross-sectional view of a semiconductor device in a second example of this embodiment mode. Constructional portions similar to those of FIG. 1 are designated by the same reference numerals as FIG. 1.

In the semiconductor device shown in FIG. 1, the trench 21 formed on the rear face 1b of the semiconductor substrate 1 has a depth for locating the bottom portion 21a within the FS layer 3a. However, as shown in FIG. 5, the depth of the trench 21 within FIG. 1 can be also changed. Namely, in the semiconductor device shown in FIG. 5, the trench 21 formed on the rear face 1b of the semiconductor substrate 1 passes through the FS layer 3a, and the bottom portion 21a of the trench 21 reaches the N⁻ type layer 4.

Thus, in accordance with the semiconductor device shown in FIG. 5, the FS layer 3a attains an interrupting state of the transversal electric current path. Therefore, a large effect is obtained in comparison with the semiconductor device shown in FIG. 1.

When plural trenches 21 are formed, all these trenches 21 may be unified at the same depth and may be also set to be different in depth. For example, the first example and the second example may be also combined.

Further, in this embodiment mode, a case for forming the insulator of one kind within the trench 21 has been explained in the first and second examples, but insulators of plural kinds may be also formed. For example, an $SiO_2$ film may be formed in an inner wall of the trench 21, and PolySi adding no electrically conductive impurities thereto may be also formed on the surface of the $SiO_2$ film.

Further, if all or one portion of the interior of the trench 21 functions as an insulator with respect to the FS layer 3a and the resistance of the FS layer 3a can be increased, both the insulator and an electric conductor may be also formed within the trench 21. For example, the $SiO_2$ film may be formed in the inner wall of the trench 21, and PolySi adding the electrically conductive impurities thereto may be also formed on the surface of the $SiO_2$ film. In this case, the electric potential of PolySi can be further set to be floated and can be also set to a collector electric potential. In this case, it is preferable to set the electric potential of PolySi to the collector electric potential. This is because the spread of a depletion layer can be restrained and it is advantageous in withstand voltage of the semiconductor device when polySi within the trench is set to the collector electric potential.

Second Embodiment Mode

Figure 6:
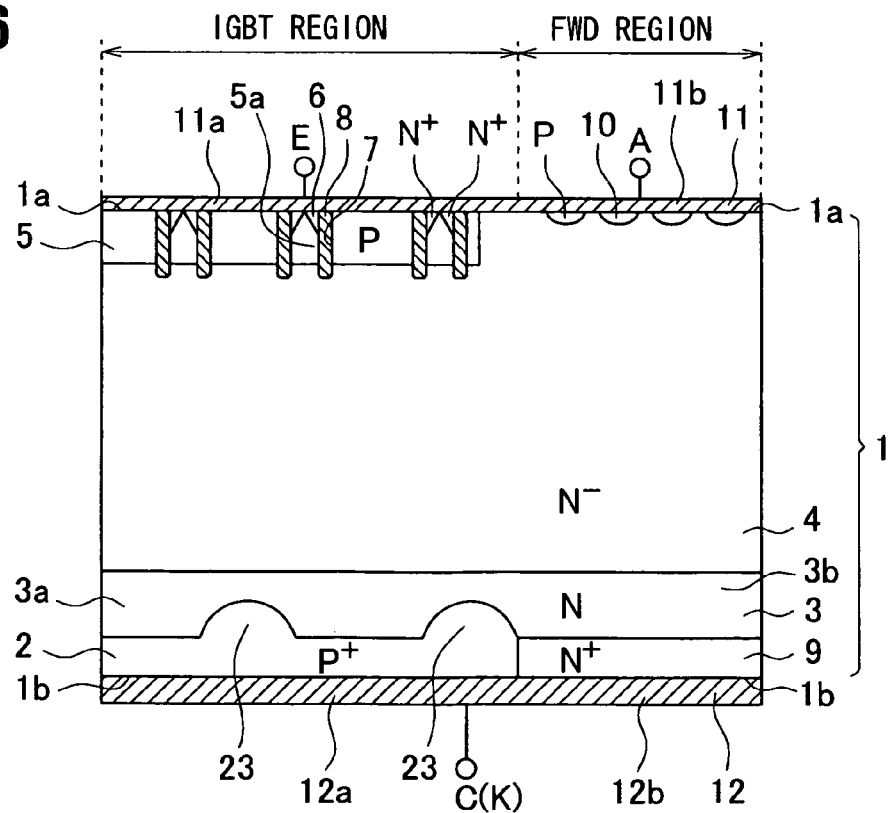
FIG. 6 is a cross sectional view showing a semiconductor device according to a second embodiment.
Figure 7:
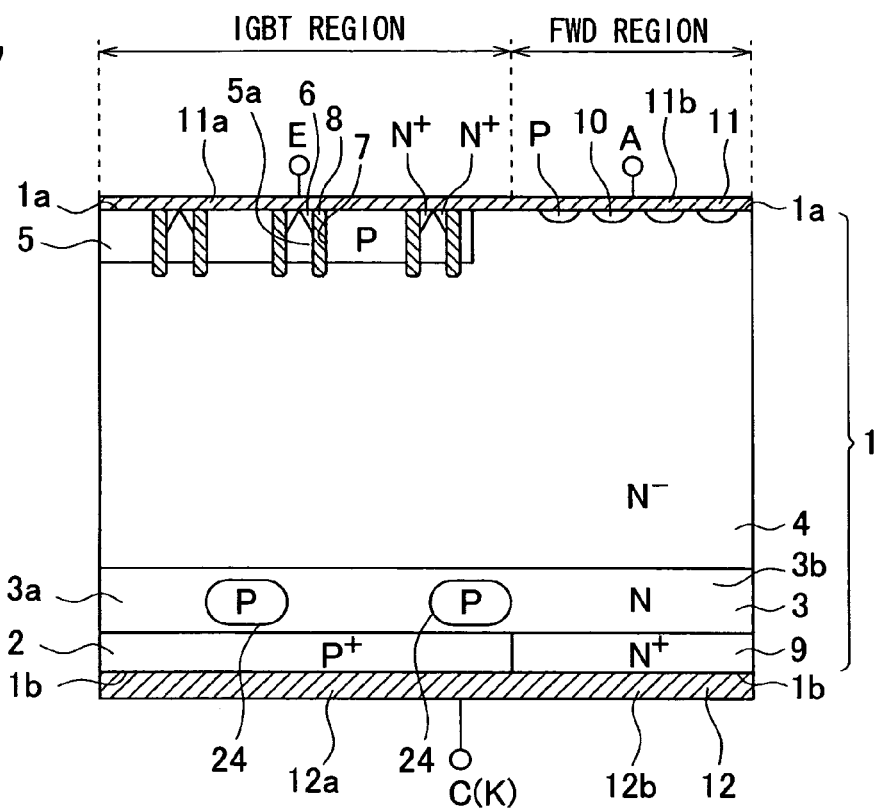
FIG. 7 is a cross sectional view showing a semiconductor device according to a modification of the second embodiment.

FIGS. 6 and 7 show cross-sectional views of the semiconductor devices in the first and second examples of this embodiment mode. In these figures, constructional portions similar to those of FIG. 1 are designated by the same reference numerals as FIG. 1.

In this embodiment mode, an example for increasing the transversal resistance of the FS layer 3a of the IGBT area by a P type area instead of the trench 21 within FIGS. 1 and 5 will be explained.

The semiconductor device shown in FIG. 6 is set to a construction in which one portion 23 of a $P^+$ type collector area 2 is projected toward the FS layer 3a in plural places, and one portion of the FS layer 3a within FIG. 14 is replaced with a P type area 23. In other words, plural P type areas 23 as a resistance increasing means connected to the $P^+$ type collector area 2 are formed within the FS layer 3a. Similar to the trench 21 explained in the first embodiment mode, these P type areas 23 are arranged at an equal interval in the transversal direction within FIG. 6 in the entire area of the FS layer 3a within the IGBT area. One P type area 23 has a shape having a predetermined width and extending in the depth direction within this figure. Further, for example, these P type areas 23 can be formed by implanting ions separately from the purpose of formation of the $P^+$ type collector area 2.

Further, in the semiconductor device shown in FIG. 7, differing from the semiconductor device shown in FIG. 6, P type areas 24 as plural resistance increasing means not continued to the $P^+$ type collector area 2 are formed within the FS layer 3a. These P type areas 24 can be formed by deeply adjusting the depth of the ion implantation in comparison with a case for forming the P type area 23 shown in FIG. 6 by the ion implantation. The semiconductor device shown in FIG. 7 has a structure similar to that of the semiconductor device shown in FIG. 6 except that no P type area 24 is continued to the $P^+$ type collector area 2.

Since the transversal resistance component is newly formed with respect to the FS layer 3a of the IGBT area by the P type areas 23, 24 within the FS layer 3a in this embodiment mode, this embodiment mode has effects similar to those of the first embodiment mode.

Third Embodiment Mode

Figure 8:
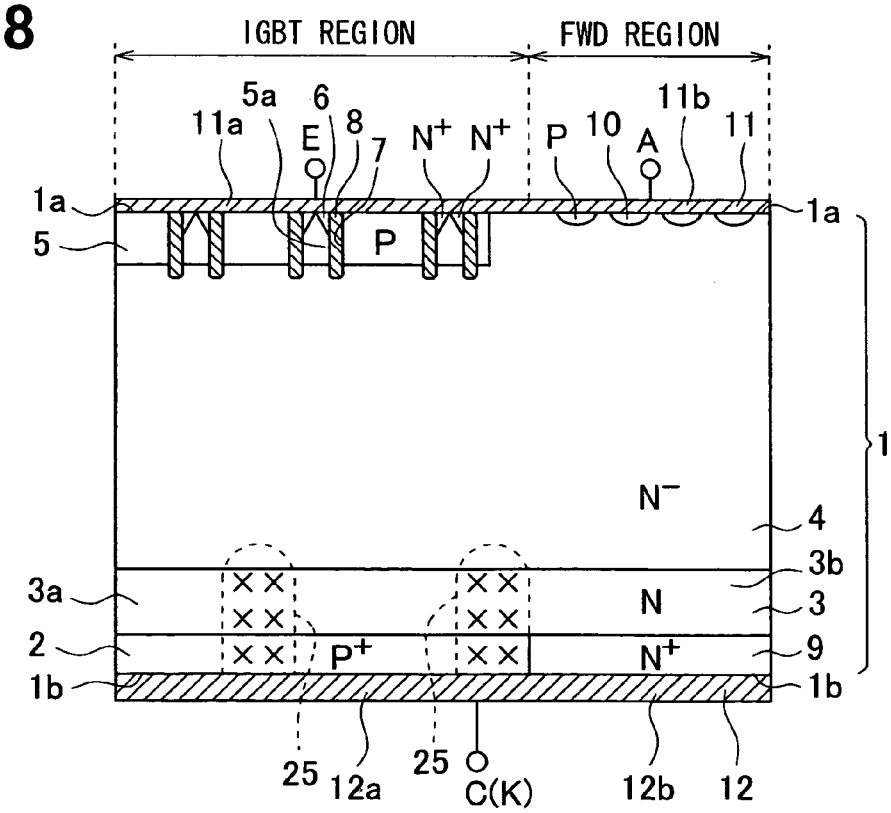
FIG. 8 is a cross sectional view showing a semiconductor device according to a third embodiment.
Figure 9:
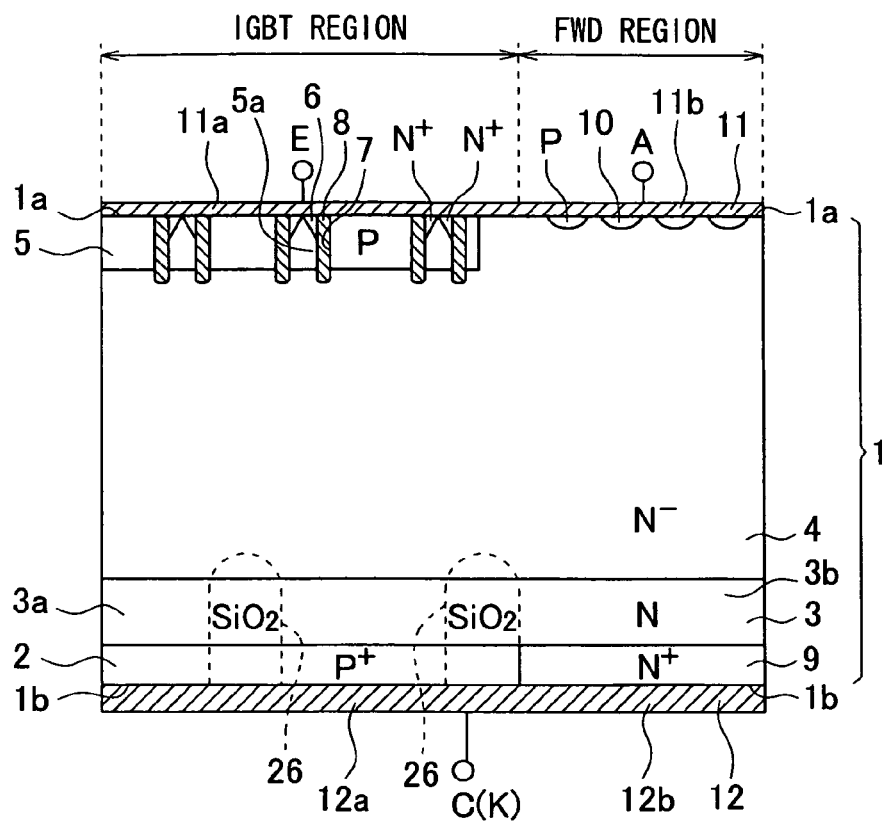
FIG. 9 is a cross sectional view showing a semiconductor device according to a modification of the third embodiment.

FIGS. 8 and 9 show cross-sectional views of the semiconductor devices in the first and second examples of this embodiment mode. In these figures, constructional portions similar to those of FIG. 1 are designated by the same reference numerals as FIG. 1.

In this embodiment mode, an example for increasing the transversal resistance of the FS layer 3a of the IGBT area by forming an ion implanting area for implanting ions instead of the trench 21 within FIGS. 1 and 5 will be explained.

In the semiconductor device shown in FIG. 8, a damage area 25 giving damage thereto by the ion implantation is formed within the FS layer 3a of the IGBT area. In this damage area 25, which provides a low crystallinity region, crystal property is reduced in comparison with other areas, and electric resistance is increased in comparison with the other areas. For example, this damage area 25 is formed from the rear face 1b of the semiconductor substrate 1 to the $N^{31}$ type layer 4 so as to interrupt the transversal electric current path of the FS layer 3a. Similar to the trench 21 explained in the first embodiment mode, the damage area 25 is arranged at an equal interval in the transversal direction within FIG. 8 in the entire area of the FS layer 3a within the IGBT area. One damage area 25 is formed in a shape having a predetermined width and extending in the depth direction within this figure. The kind of the ion used in the ion implantation can be suitably selected.

Further, in the semiconductor device shown in FIG. 9, plural $SiO_2$ areas 26 are formed in the FS layer 3a instead of the damage area 25 within FIG. 8. Further, these $SiO_2$ areas 26 can be formed by performing the ion implantation using O (oxygen) as the ion kind separately from the formation of the N type layer 3. An SiN area may be also formed instead of the $SiO_2$ area 26 by using N (nitrogen) instead of the use of O (oxygen) as the ion kind.

Since the transversal resistance component is newly formed with respect to the FS layer 3a of the IGBT area by the damage area 25 and the $SiO_2$ area 26 mentioned above in this embodiment mode, this embodiment mode has effects similar to those of the first embodiment mode.

Fourth Embodiment Mode

Figure 10:
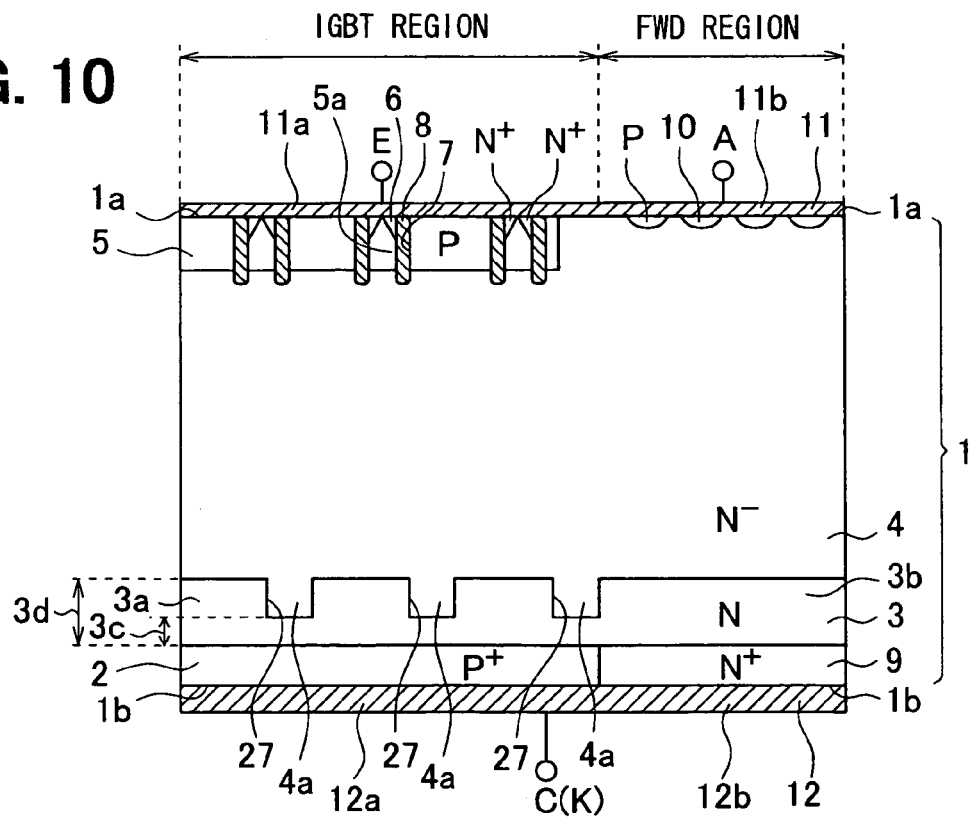
FIG. 10 is a cross sectional view showing a semiconductor device according to a fourth embodiment.
Figure 11:
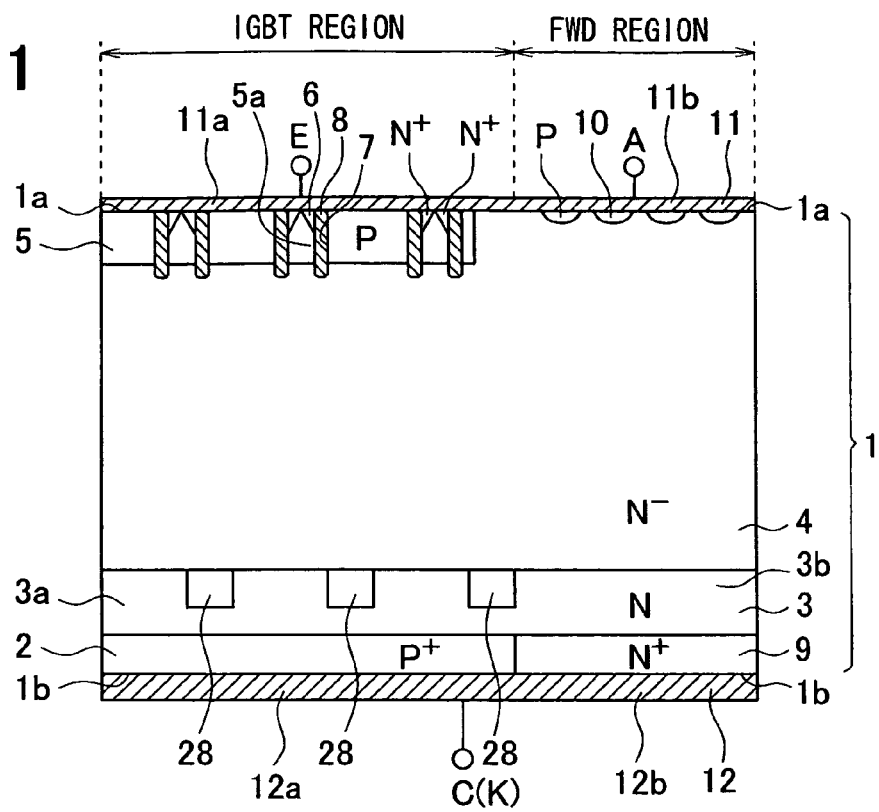
FIG. 11 is a cross sectional view showing a semiconductor device according to a modification of the fourth embodiment.

FIGS. 10 and 11 show cross-sectional views of the semiconductor devices in the first and second examples of this embodiment mode. In these figures, constructional portions similar to those of FIG. 1 are designated by the same reference numerals as FIG. 1.

In this embodiment mode, an example for increasing the transversal resistance of the FS layer 3a of the IGBT area by partially changing the width and the impurity concentration of the FS layer 3a instead of the formation of the trench 21 within FIGS. 1 and 5 will be explained.

The semiconductor device shown in FIG. 10 is set to a structure in which one portion 4a of the $N^-$ type layer 4 lower in impurity concentration than the FS layer 3a is projected in plural places with respect to the FS layer 3a of the IGBT area. One portion 4a of this $N^-$ type layer 4 corresponds to a resistance increasing means.

In other words, plural concave portions 27 partially having a concave shape from the surface 1a side of the semiconductor substrate 1 of the FS layer 3a are formed, and a width 3c in the thickness direction of the semiconductor substrate 1 in its portion is set to be narrower than the width 3d of another portion.

Further, in the semiconductor device shown in FIG. 10, similar to the trench 21 explained in the first embodiment mode, the concave portion 27 is arranged at an equal interval in the transversal direction within this figure in the entire area of the FS layer 3a within the IGBT area. One concave portion 27 is formed in a shape having a predetermined width and extending in the depth direction within this figure.

Further, concretely, in the semiconductor device shown in FIG. 10, the width 3c in a forming portion of the concave portion 27 of the FS layer 3a is set to about half of the width 3d in another portion. The width 3c in the forming portion of the concave portion 27 of the FS layer 3a is set to a size sufficient for this portion to function as the FS layer.

Further, in the semiconductor device shown in FIG. 11, similar to the trench 21 explained in the first embodiment mode, a low concentration area 28 lower in impurity concentration than another area within the FS layer is arranged in the FS layer 3a at an equal interval in the transversal direction within this figure in the entire area of the FS layer 3a within the IGBT area. One low concentration area 28 is formed in a shape having a predetermined width and extending in the depth direction within this figure. This low concentration area 28 is an area different in impurity concentration than the N⁻ type layer 4, but may be also set to an area higher or lower in impurity concentration than the N⁻ type layer 4.

For example, the FS layer 3a having the concave portion 27 within FIG. 10 and the FS layer 3a having the low concentration area 28 within FIG. 11 can be formed by selectively performing the ion implantation in a forming area of the concave portion 27 or the low concentration area 28, and other areas except for this forming area.

Since the transversal resistance component is newly formed with respect to the FS layer 3a of the IGBT area by one portion 4a of the N⁻ type layer 4 and the low concentration area 28 mentioned above in this embodiment mode, this embodiment mode has effects similar to those of the first embodiment mode.

Fifth Embodiment Modes

Figure 12:
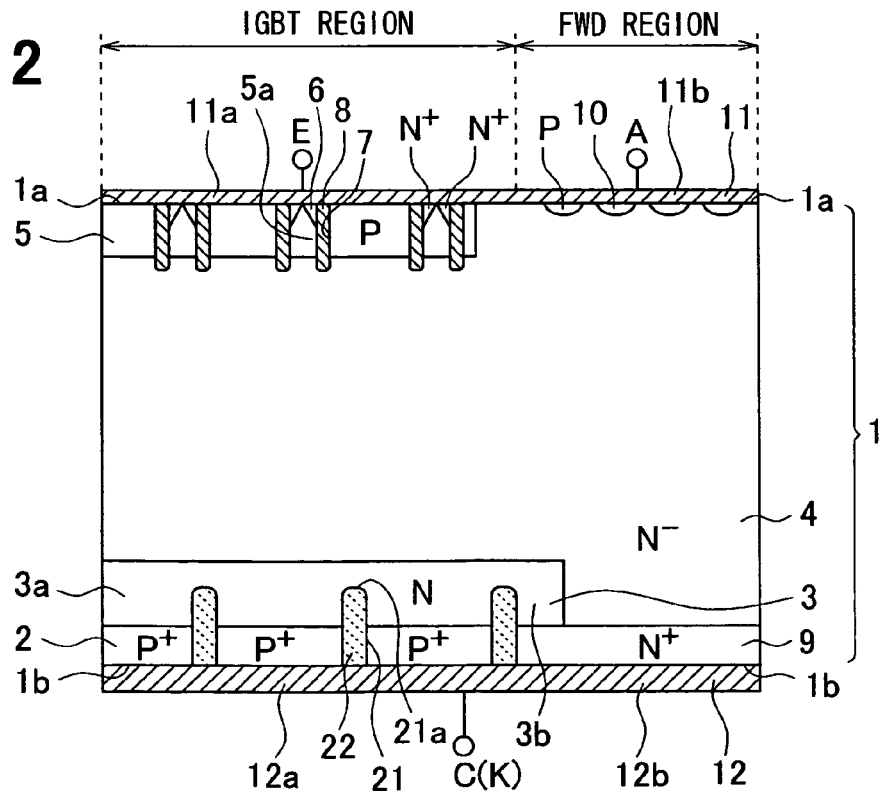
FIG. 12 is a cross sectional view showing a semiconductor device according to a fifth embodiment.
Figure 13:
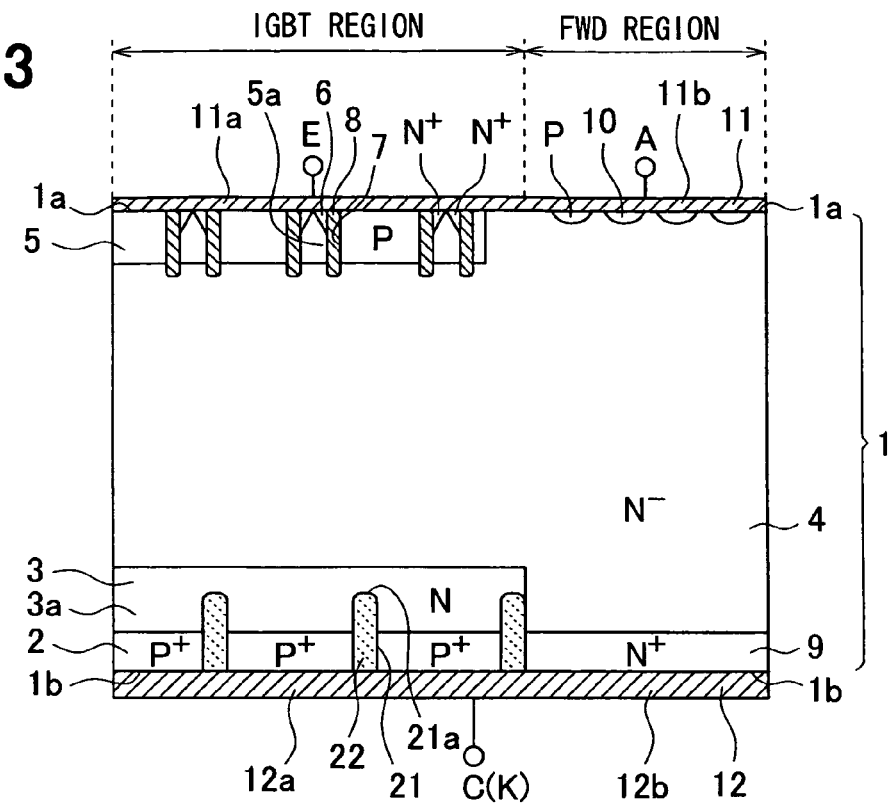
FIG. 13 is a cross sectional view showing a semiconductor device according to a modification of the fifth embodiment.

FIGS. 12 and 13 show cross-sectional views of the semiconductor devices in the first and second examples of a fifth embodiment mode. In these figures, constructional portions similar to those of FIG. 1 are designated by the same reference numerals as FIG. 1.

Each of the above embodiment modes explains a case in which the FS layer 3b is formed in the entire area of the FWD area among the semiconductor substrate 1, and is joined to all the N⁺ type layers 9 of the FWD area as an example. However, as shown in FIG. 12, the FS layer 3b may be also formed in only one portion among the FWD area so as to be joined to one portion of the N⁺ type layer 9.

Further, as shown in FIG. 13, the N type layer 3 may be also formed in only the IGBT area and the IGBT area among the FWD area. In this case, it is preferable that the N type layer 3 is also formed in the FWD area as well as the IGBT area. This is because effects of the present disclosure become notable in the case of such a structure. Namely, when the resistance increasing means such as the insulator 22, etc. within the above trench 21 is not formed in the case of such a structure, electric resistance is lowered in a path in which the electronic electric current from the IGBT channel located on the surface side of the semiconductor substrate 1 is flowed to the rear face electrode 12 of the semiconductor substrate 1 through the N⁻ type layer 4 and the FS layer 3a within the IGBT area and the FS layer 3b and the N⁺ type area 9 of the FWD area. Therefore, a snap back phenomenon is easily generated. However, the generation of this snap back phenomenon can be restrained by forming the resistance increasing means such as the insulator 22 within the above trench 21, etc. in the FS layer 3.

Further, when the N type layer 3 is formed in only the IGBT area, it can be also set to a structure in which a right-hand end of the collector area 2 within FIG. 13 is extended on the FWD area side, and no N type layer 3 is located on the collector area 2 in a right-hand end portion of the collector area 2 although this structure is not shown in the drawings.

However, a structure for always arranging the FS layer 3 between the collector area 2 and the N⁻ type layer 4 is preferable from a viewpoint of formation of a high voltage withstand structure. This is because it is possible to prevent the spread of a depletion layer from reaching the P type collector area 2 by arranging the FS layer 3 in this way.

MODIFICATIONS

In each of the above embodiment modes, the resistance increasing means such as the insulator 22 within the trench 21, etc. is formed in the entire area of the FS layer 3a of the IGBT area. However, the resistance increasing means may be also formed in only a partial area of the FS layer 3a if the generation of the snap back phenomenon can be restrained by increasing the transversal resistance of the FS layer 3a is increased. Namely, it is sufficient to arrange the resistance increasing means within a path in which the electronic electric current from the IGBT channel located on the surface side of the semiconductor substrate 1 among the FS layer 3a of the IGBT area is flowed to the rear face electrode 12 of the semiconductor substrate 1 through the N⁻ type layer 4 and the FS layer 3a within the IGBT area, and the FS layer 3b and the N⁺ type area 9 of the FWD area.

Accordingly, it is sufficient if the resistance increasing means such as the insulator 22 within the above trench 21, etc. is arranged in at least a boundary portion with respect to the FWD area among the FS layer 3a of the IGBT area. The boundary portion means a boundary portion of an area functioning as IGBT and an area functioning as a diode, and also means that the boundary portion includes a buffer area of IGBT and FWD and the vicinity of the boundary portion.

Further, in each of the above embodiment modes, a case for setting the shape of the resistance increasing means such as one trench 21, etc. to a shape extending in the depth direction within figures has been explained as an example. However, the resistance increasing means such as the trench 21, etc. may not be necessarily formed in one continuous shape in the depth direction in figures. The resistance increasing means such as the trench 21, etc. may be also formed in a shape divided into plural portions in the depth direction in figures. Namely, plural resistance increasing means can be also arranged in the transversal direction within figures and the depth direction within figures.

Since the transversal resistance component can be also newly formed in this way with respect to the FS layer 3a of the IGBT area in comparison with a case for arranging no resistance increasing means, effects similar to those of each of the above embodiment modes are obtained.

In each of the above embodiment modes, a case for adopting the so-called trench gate structure as a structure of the gate electrode of IGBT has been explained as an example. However, the present embodiments are not limited to the trench gate structure, but can be also set to another structure such as a planar structure, etc.

Further, in each of the above embodiment modes, IGBT is set to the so-called thinning-out structure. However, the present embodiments are not limited to this structure, but can be also set to another structure.

In each of the above embodiment modes, a case for forming the emitter electrode (E) 11a and the anode electrode (A) 11b as the single electrode 11 of a continuous shape has been explained as an example. However, if it is a state mutually electrically connected, the emitter electrode (E) 11a and the anode electrode (A) 11b may not be necessarily constructed by the single electrode 11 of a continuous shape. The collector electrode (C) 12a and the cathode electrode (K) 12b are also similarly constructed.

In each of the above embodiment modes, a case for respectively setting the first conductivity type and the second conductivity type to the N type and the P type has been explained as an example. However, the first conductivity type and the second conductivity type can be also reversely set to the P type and the N type. Namely, IGBT of the N channel type has been explained as an example, but the present embodiments can be also applied to IGBT of the P channel type.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor substrate having an IGBT region and a diode region;
an IGBT disposed in the IGBT region of the substrate;
a diode disposed in the diode region of the substrate; and
a resistive region, wherein
the semiconductor substrate has a first side and a second side opposite to the first side,
the semiconductor substrate includes a first semiconductor layer having a first conductive type and a second semiconductor layer having the first conductive type,
the second semiconductor layer has an impurity concentration higher than an impurity concentration of the first semiconductor layer,
the second semiconductor layer is disposed on the first semiconductor layer on the second side in the IGBT region,
the IGBT includes a collector region having a second conductive type, a collector electrode, a base region having the second conductive type, an emitter region having the first conductive type, an emitter electrode, a channel region, and a gate electrode,
the collector region is disposed on the second semiconductor layer on the second side in the IGBT region,
the collector electrode is electrically coupled with the collector region,
the base region is disposed in a surface portion of the first semiconductor layer on the first side in the IGBT region,
the emitter region is disposed in a surface portion of the base region,
the emitter electrode is electrically coupled with the emitter region,
the channel region is disposed in a part of the base region between the emitter region and the first semiconductor layer,
the gate electrode contacts the channel region through a gate insulation film,
the diode includes an anode region having the second conductive type, an anode electrode, and a cathode electrode,
the anode region is disposed in a surface portion of the first semiconductor layer on the first side in the diode region,
the anode electrode is electrically coupled with the anode region and the emitter electrode,
the cathode electrode is disposed on the first semiconductor layer on the second side in the diode region,
the cathode electrode is electrically coupled with the collector electrode, and
the resistive region for increasing a resistance of the second semiconductor layer is disposed in a part of the second semiconductor layer, which is arranged in a current path between the channel region in the IGBT region and the cathode electrode in the diode region through the first semiconductor layer and the second semiconductor layer with bypassing the collector region.

2. The device according to claim 1, wherein
the diode further includes a high concentration semiconductor region having the first conductive type,
the high concentration semiconductor region has an impurity concentration higher than the impurity concentration of the first semiconductor layer,
the high concentration semiconductor region is disposed in the diode region between the first semiconductor layer and the cathode electrode, and
the high concentration semiconductor region is electrically coupled with the second semiconductor layer and the cathode electrode.

3. The device according to claim 2, wherein
the high concentration semiconductor region provides a cathode region,
the high concentration semiconductor region includes first and second high concentration semiconductor regions,
the first high concentration semiconductor region has the first conductive type, and the second high concentration semiconductor region has the first conductive type,
the first high concentration semiconductor region has an impurity concentration higher than the impurity concentration of the first semiconductor layer,
the second high concentration semiconductor region has an impurity concentration higher than the impurity concentration of the first high concentration semiconductor region, and
the first high concentration semiconductor region is disposed on the first semiconductor layer, and the second high concentration semiconductor region is disposed on the first high concentration semiconductor region.

4. The device according to claim 1, wherein
the resistive region increases the resistance of the second semiconductor layer to be larger than a resistance of the first semiconductor layer.

5. The device according to claim 1, wherein
the resistive region is disposed at a boundary portion of the second semiconductor layer between the IGBT region and the diode region.

6. The device according to claim 1, wherein
the resistive region is an insulator in a trench,
the insulator in the trench is disposed on the second side of the collector region, and
the insulator in the trench penetrates the collector region, and reaches the second semiconductor layer.

7. The device according to claim 6, wherein
the insulator in the trench penetrates the second semiconductor layer, and reaches the first semiconductor layer.

8. The device according to claim 1, wherein
the resistive region is a second conductive type semiconductor region in the second semiconductor layer.

9. The device according to claim 1, wherein
the resistive region is a low crystallinity region in the second semiconductor layer, and
the low crystallinity region has a crystallinity degree, which is lower than a crystallinity degree of the second semiconductor layer.

10. The device according to claim 1, wherein the resistive region is made of oxide or nitride of the second semiconductor layer.

11. The device according to claim 1, wherein the resistive region is a low impurity concentration region having the first conductive type in the second semiconductor layer, and the low impurity concentration region has an impurity concentration, which is lower than the impurity concentration of the second semiconductor layer.

12. The device according to claim 1, wherein the resistive region is provided by a part of the first semiconductor layer, which protrudes toward the second semiconductor layer, so that a thickness of a part of the second semiconductor layer becomes smaller than a thickness of another part of the second semiconductor layer.

\* \* \* \* \*